(12) United States Patent
Cowley et al.

(10) Patent No.: US 9,502,359 B2
(45) Date of Patent: Nov. 22, 2016

(54) INTEGRATED CIRCUIT COMPONENT SHIELDING

(71) Applicant: INTEL CORPORATION, Santa Clara, CA (US)

(72) Inventors: Nicholas P. Cowley, Wiltshire (GB); Ruchir Saraswat, Wiltshire (GB)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/008,230

(22) Filed: Jan. 27, 2016

(65) Prior Publication Data

US 2016/0163655 A1    Jun. 9, 2016

Related U.S. Application Data

(62) Division of application No. 14/195,661, filed on Mar. 3, 2014, now Pat. No. 9,281,281.

(51) Int. Cl.
| | |
|---|---|
| *H01L 21/44* | (2006.01) |
| *H01L 23/552* | (2006.01) |
| *H01L 23/60* | (2006.01) |
| *H01L 23/13* | (2006.01) |
| *H01L 23/66* | (2006.01) |
| *H01L 21/768* | (2006.01) |

(52) U.S. Cl.
CPC ....... *H01L 23/552* (2013.01); *H01L 21/76877* (2013.01); *H01L 21/76898* (2013.01); *H01L 23/13* (2013.01); *H01L 23/60* (2013.01); *H01L 23/66* (2013.01); *H01L 2224/16145* (2013.01); *H01L 2224/16225* (2013.01)

(58) Field of Classification Search
CPC ............. H01L 23/60; H01L 21/76877; H01L 23/552; H01L 21/76898
USPC .......................... 438/463, 667; 257/659, 532
See application file for complete search history.

(56) References Cited

U.S. PATENT DOCUMENTS

| | | | |
|---|---|---|---|
| 5,151,770 A * | 9/1992 | Inoue ..................... | H01L 23/552 257/508 |
| 7,609,500 B2 | 10/2009 | Anthony et al. | |
| 9,054,094 B2 | 6/2015 | Anthony et al. | |
| 2012/0320558 A1 * | 12/2012 | Foster .................. | H05K 1/0218 361/818 |

* cited by examiner

*Primary Examiner* — Long K Tran
(74) *Attorney, Agent, or Firm* — Schwabe, Williamson & Wyatt, P.C.

(57) ABSTRACT

Embodiments of shielding apparatuses are disclosed herein. In some embodiments, a shielding apparatus may include first and second conductive regions and a plurality of vias disposed between the first and second conductive regions. The first and second conductive regions and the plurality of vias may surround an integrated circuit (IC) component and individual vias of the plurality of vias are spaced relative to one another to shield incoming or outgoing electromagnetic interference (EMI). Other embodiments may be described and/or claimed.

10 Claims, 11 Drawing Sheets

INTEGRATED CIRCUIT COMPONENT SHIELDING

RELATED APPLICATION

This application is a divisional application of U.S. patent application Ser. No. 14/195,661, entitled INTEGRATED CIRCUIT COMPONENT SHIELDING, filed Mar. 3, 2014, and claims priority to the Ser. No. 14/195,661 application. The Specification of Ser. No. 14/195,661 is hereby fully incorporated by reference.

TECHNICAL FIELD

The present disclosure relates generally to the field of integrated circuits (ICs), and more particularly, to IC component shielding.

BACKGROUND

Electromagnetic interference (EMI) may interfere with the performance of integrated circuit (IC) devices. Existing techniques to address conductive EMI include separate power supplies, capacitive filtering, and use of star connectivity arrangements, for example. Existing techniques to address radiative EMI include spatial separation, insertion of substrate or deep well barriers, or insertion of grounded metal barriers between blocks, for example. None of these techniques may sufficiently address the challenges posed by EMI such as, for example, conductive radiation that is not constrained to planar sources.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
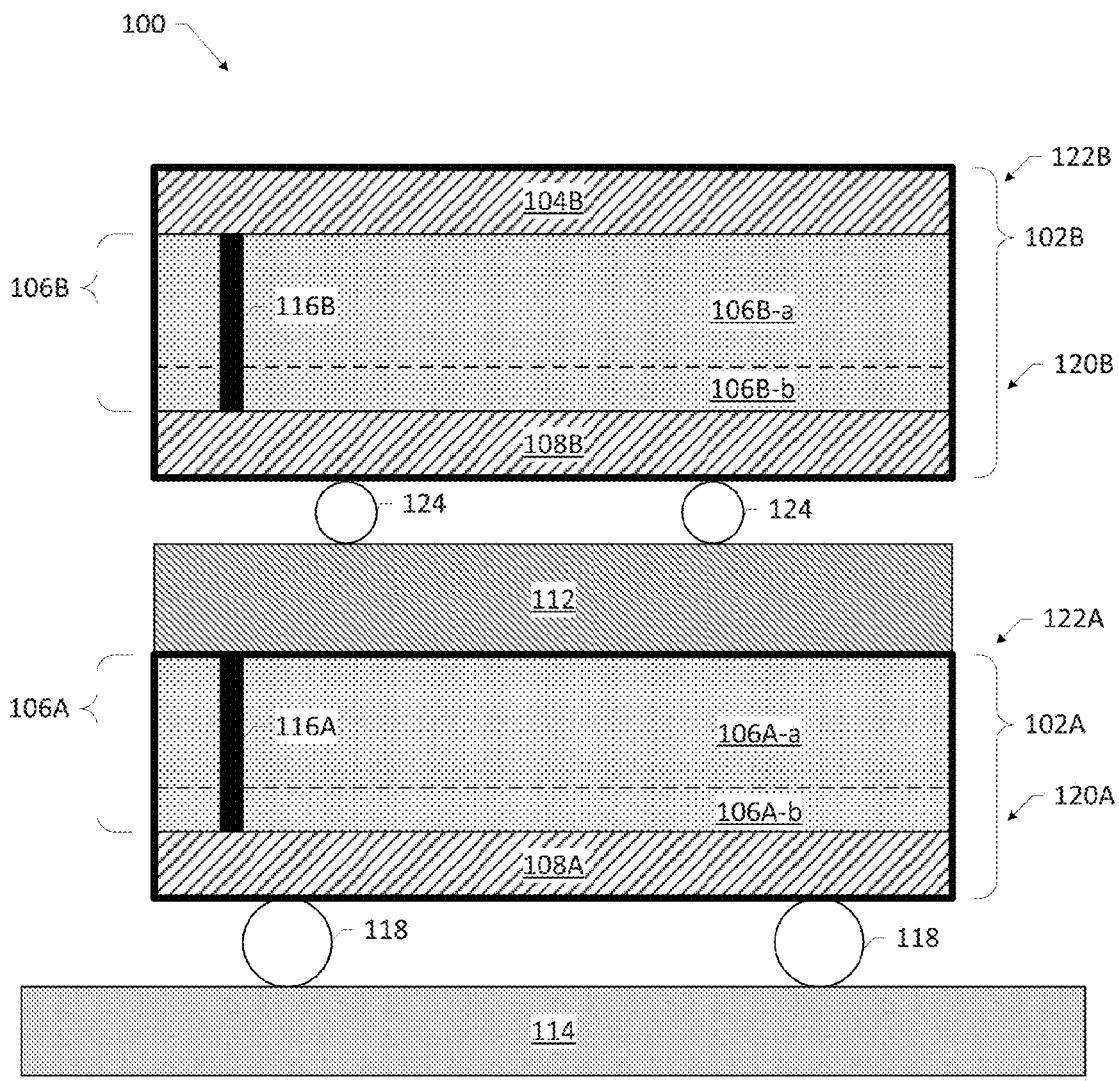
FIG. 1 is a side cross-sectional view of an illustrative integrated circuit (IC) package which may include a shielding apparatus, in accordance with some embodiments.

Embodiments of shielding apparatuses are disclosed herein. A shielding apparatus may include first and second end conductive regions. An intermediate conductive region (which may include a plurality of vias) may be disposed between the first and second end conductive regions. The first and second end conductive regions and the intermediate conductive region may surround an integrated circuit (IC) component, and the intermediate conductive region may be formed to shield incoming or outgoing electromagnetic interference (EMI). In some embodiments, individual vias of a plurality of vias included in the intermediate conductive region may be spaced relative to one another to shield incoming or outgoing EMI.

The shielding techniques and apparatuses disclosed herein may mitigate EMI in sensitive IC components, thereby improving the performance of IC devices. In particular, spurious signals from an "aggressor" component may couple (e.g., conductively or radiatively) to a "victim" component within or between dies in an IC device. This coupling phenomenon may be referred to as "on die coupling" in some contexts, and may affect analog or digital aggressor and/or victim components. This coupling may lead to a degradation of signal quality within the victim component through any one or more of a number of mechanisms, including local oscillator pulling, supply modulation and bias modulation. For example, clock circuits responsible for clocking data transmissions may be particularly sensitive to jitter at the clock edge. Such jitter may narrow the rectangular window in which data may be transmitted (sometimes referred to as "eye reduction"), increasing the likelihood of a data error. Jitter at the clock edge may be caused by EMI from aggressor components, such as other clocks, radios, or any component that generates radio frequency (RF) signals, for example.

Various embodiments of the shielding apparatuses disclosed herein may provide a three-dimensional conductive screen to surround victim and/or aggressor components to shield incoming and/or outgoing EMI, thereby reducing signal degradation and improving performance. In some embodiments, a three-dimensional conductive screen may be formed from silicon metal layers of multiple dies and redistribution layers available within heterogeneous stack arrangements. In some embodiments, through silicon connections (TSCs), such as through silicon vias (TSVs), may be used to access the screened components to transmit signals to and/or from the screened components. The shielding apparatuses disclosed herein may be integrated into dies and IC packages using existing fabrication techniques and structures, and may be customized using known physical principles to provide shields against unwanted frequencies and directions of EMI. In some embodiments, the shielding apparatuses disclosed herein may provide a Faraday cage for shielding against undesired EMI. Additionally, the shielding apparatuses and techniques disclosed herein may be readily implemented using existing heterogeneous IC design and fabrication techniques, and may have a desirable form factor.

One illustrative application in which the shielding apparatuses and related techniques disclosed herein may be advantageously applied is ICs for connectivity applications (e.g. mobile phone or tablet applications). In such applications, it may be desirable to embed transceivers for different communication protocols (e.g., Bluetooth and WiFi) in a common die or set of dies. However, the different operating frequencies of these communication protocols may result in undesirable EMI between the transceivers. For example, in some applications, WiFi channels may be centered on a frequency range between 2412 in 2484 megahertz, with a 5 megahertz spacing, while the Bluetooth operating band may occupy a frequency range between 2.4 and 2.4835 megahertz. Although these frequency ranges may not overlap, the local oscillator for the transceiver of one protocol (the "aggressor protocol") may "leak" to the local oscillator of the transceiver for the other protocol (the "victim protocol"), introducing a spur on the victim local oscillator. Aggressor signals appearing at the input of the victim transceiver may be down converted to lie on top of the victim frequency range, thus degrading signal quality. Reducing the leakage of signal between the aggressor protocol and the victim protocol may improve the performance of the victim protocol.

Another illustrative application is IC devices in which a transceiver for the Global System for Mobile Communications (GSM) communication protocol shares a die or set of dies with a Double Data Rate Memory (DDR) interface. GSM communications may occupy a frequency range between 1710 and 1880 megahertz, while a DDR interface may operate at, for example, 1866 megatransfers per second with a clock rate of 933 megahertz. Harmonics of the clock rate will lie at multiples of 933 megahertz, and thus the second harmonic at 1866 megahertz may interfere with the GSM band. Moreover, DDR data transmissions may be pseudo-random bit stream (PRBS) modulated, and thus may have an approximately equal probability of occupying any frequency up to the clock rate of 933 megahertz. Consequently, second harmonics of data transfer between 855 megahertz and 933 megahertz may interfere with the GSM band (between 1710 and 1880 megahertz), third harmonics of data transfer between 570 megahertz and 627 megahertz may interfere with the GSM band, and so on for additional harmonics. Reducing the leakage of DDR interface radiation to the GSM transceiver may improve GSM performance.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous. As used herein, the term "signal" may refer to any information-bearing waveform, power delivery waveform, and any other electrical, optical, acoustic or other waveform that may travel within an IC device. As used herein, the term "ring" may refer to any closed perimeter shape, such as a circle, square, rectangle, polygon, or any other closed contour. As used herein, the term "surrounded" may refer to being surrounded in two dimensions (e.g., as a planar circle surrounds a point on the plane within the circle) or in three dimensions (e.g., as a sphere surrounds a point within the sphere). One element need not be continuous to surround another; for example, a finite set of points distributed in the shape of a circle may surround a point within the circle.

FIG. 1 is a side cross-sectional view of an illustrative IC package 100 which may include a shielding apparatus, in accordance with some embodiments. As illustrated, the package 100 may include a first die 102A and a second die 102B. Although two dies 102A and 102B are illustrated in FIG. 1, the shielding apparatuses disclosed herein may be used in IC devices having one die (or other IC assembly) or three or more dies.

Embodiments of the first die 102A are now discussed; the second die 102B may be formed in accordance with any of these embodiments, or any other suitable embodiment. The first die 102A may be one of a plurality of dies formed on a semiconductor material wafer (e.g., a silicon wafer). The first die 102A may include a semiconductor portion 106A, which may include a semiconductor substrate portion 106A-a and an active components portion 106A-b. The active components portion 106A-b may include one or more semiconductor devices, such as transistors. These semiconductor devices may be arranged to form circuitry to perform various operations. In some embodiments, the semiconductor devices included in the active components portion 106A-b may be formed using complementary metal-oxide-silicon (CMOS) fabrication techniques such as thin film deposition, lithography, etching and the like. In some embodiments, the first die 102A may be, include, or be a part of a processor, memory, system-on-chip (SoC) or application specific integrated circuit (ASIC). In some embodiments, an electrically insulative material such as, for example, molding compound or underfill material (not shown) may encapsulate at least a portion of the first die 102A.

The first die 102A may be attached to the package substrate 114 in any of a number of configurations. For example, in some embodiments, an active side 120A of the die 102A (the side closer to the active components portion 106A-b) may be arranged to face the package substrate 114, and one or more solder bumps or balls 118 may be used to electrically and/or physically couple the first die 102A and the package substrate 114. An inactive side 122A may be disposed opposite from the active side 120A. The arrangement depicted in FIG. 1 is simply illustrative, and any other suitable arrangement may be used.

The first die 102A may include a front metal stack 108A. The front metal stack 108A may include one or more conductive pathways to route signals from the active components portion 106A-b to the package substrate 114 or other components. The first die 102A may include one or more vias 116A, which may route signals through the semiconductor substrate portion 106A-a and which may be exposed on the inactive side 122A of the first die 102A. In some embodiments, the vias 116A may route signals between the active components portion 106A-b and/or the front metal stack 108A and a redistribution layer 112, discussed below. The front metal stack 108A may be formed as a plurality of metal layers separated by an insulating material (e.g., a dielectric material) and electrically connected by vias. Example structures that may be used in any of the metal stacks described herein are discussed below with reference to FIG. 4.

The second die 102B may include a front metal stack 108B, a semiconductor portion 106B, vias 116B and a back metal stack 104B. The semiconductor portion 106B may include a semiconductor substrate portion 106B-a and an active components portion 106B-b. An active side 120B may be disposed opposite from an inactive side 122B. Elements of the second die 102B may be formed in accordance with any of the embodiments discussed above with reference to the analogous elements of first die 102A. The back metal stack 104B may be formed as a plurality of metal layers separated by an insulating material (e.g., a dielectric material) and electrically connected by vias, for example. The back metal stack 104B may include one or more conductive pathways to route signals from the active components portion 106B-b to other dies or other components (not shown).

The dies 102A and 102B may be stacked such that the first die 102A is disposed between the second die 102B and the package substrate 114. The dies 102A and 102B may be electrically, optically and/or physically coupled with each other and with the package substrate 114. In some embodiments, the package substrate 114 may be an epoxy-based laminate substrate having a core and/or buildup layers. In some embodiments, the package substrate 114 may be formed from glass, ceramic, or semiconductor materials. The package substrate 114 may be a printed circuit board, or may be coupled with a printed circuit board (e.g., a motherboard). Although the dies 102A and 102B are illustrated as stacked, two or more dies may be arranged laterally on a package substrate (e.g., the package substrate 114) or in a combination of stacks and lateral arrangements.

In some embodiments, the first die 102A and the second die 102B may be electrically and/or physically coupled by a redistribution layer 112. The redistribution layer 112 may include conductive pathways which may reroute electrical connections from input/output (I/O) pads on the first die 102A and/or the second die 102B to desired locations. Power and/or information bearing signals may be transmitted through the redistribution layer 112 to the first die 102A and/or the second die 102B. In some embodiments, the redistribution layer 112 may be formed from two or more conductive layers (and may include a back metal stack of the first die 102A, not shown). In some embodiments, the redistribution layer 112 may be deposited on the inactive side 122A of the first die 102A. As illustrated in FIG. 1, conductive micro-bumps 124 may couple signals between the redistribution layer 112 and the front metal stack 108B of the second die 102B.

Figure 2:
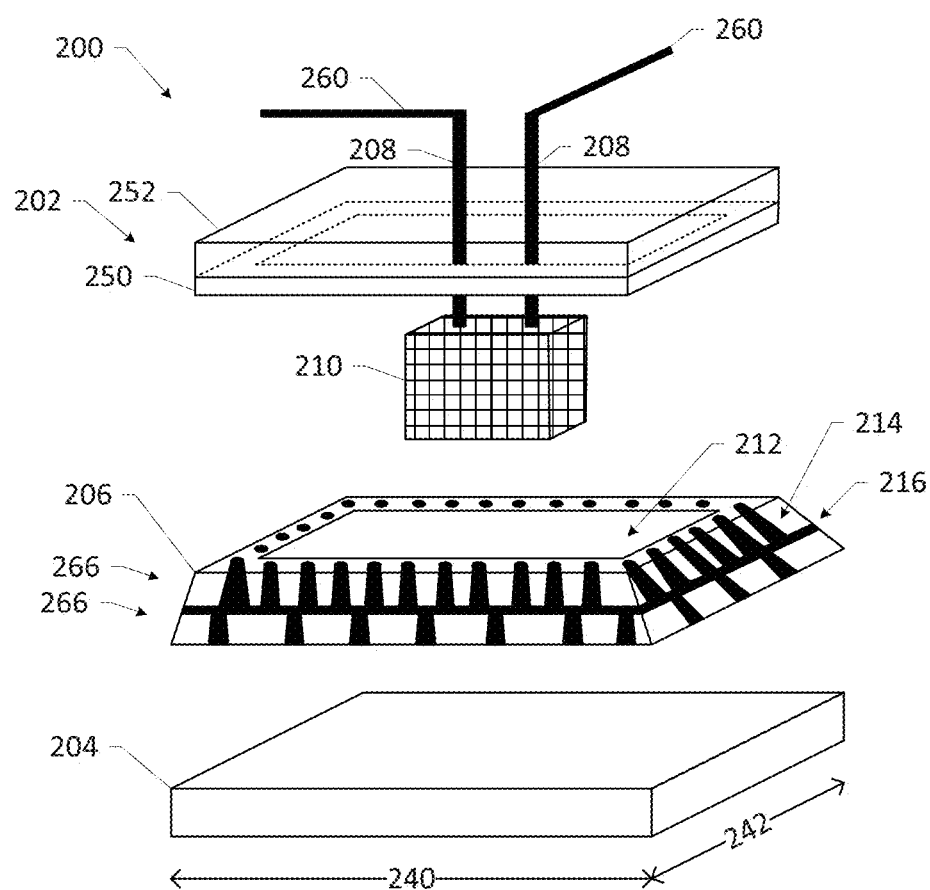
FIG. 2 is an exploded perspective view of an IC component shielded by a shielding apparatus, in accordance with some embodiments.

FIG. 2 is an exploded perspective view of an IC component 210 shielded by a shielding apparatus 200, in accordance with some embodiments. The IC component 210 may include any IC component sensitive to or highly generative of EMI, such as radio circuitry. Other non-limiting examples of components that may be included in the IC component 210 may include inductors formed in a metal stack (e.g. including those inductive components deliberately implemented and/or those inadvertently formed due to metal routing), any metal tracks that may act as an antenna (e.g., those resonating at one-quarter wavelength), capacitive plates formed in a metal stack (which may act as "patch antennas"), and any high impedance components that may act as a receiver to electrostatic or electromagnetic radiation.

The shielding apparatus 200 may include a first end conductive region 204, an intermediate conductive region 206, and a second end conductive region 202. In some embodiments, the intermediate conductive region 206 may include a plurality of vias 214 which may surround the IC component 210. The individual vias 214 may be spaced relative to one another to shield incoming or outgoing EMI, as discussed in additional detail below. The shielding apparatus 200 may be included in the IC package 100, or any suitable IC device, in any of a number of ways several examples of which are discussed below.

The intermediate conductive region 206 may surround a volume 212 in which the IC component 210 may be disposed. The intermediate conductive region 206 may be electrically connected with the first end conductive region 204 and the second end conductive region 202. The volume 212 may be a cavity, or may be fully or partially filled with a material (e.g., an electrical insulator). The IC component 210 may include one or more components of an IC circuit. For example, the IC component 210 may include an inductor. In some embodiments in which multiple antennas are distributed between two die for electromagnetic communicative coupling between the die, the IC component 210 may include the multiple antennas (so as to shield the multiple antennas from undesired coupling with other structures). Although the IC component 210 may be illustrated as a "box" in the accompanying drawings, this is simply for ease of illustration. The IC component 210 may take any desired form and may contact any one or more components or structures in the volume 212 surrounded by the intermediate conductive region 206.

In some embodiments, the intermediate conductive region 206 may include one or more substantially solid regions of conductive material (e.g., one or more solid rings of a metal or other conductor), a mesh material, horizontal or vertical columns of material, or any other suitable arrangements of conductive material. In some embodiments, as noted above, the intermediate conductive region 206 may include a plurality of vias 214 arranged as a plurality of layers 266 of individual vias 214 coupled by metal layers 216. Examples of various arrangements of vias in the intermediate conductive region 206 (and in the first end conductive region 204) are discussed below with reference to FIG. 4. The first and conductive region 204 and the second end conductive region 202 may be formed from any of a number of conductive materials. For example, the conductive material used to form one or more of the first end conductive region 204 and the second end conductive region 202 may include a semiconductor material (e.g., silicon). In some embodiments, the second end conductive region 202 may include an isolation portion 250. The isolation portion 250 may be formed of a conductive material and may be adjacent to a body 252 of the second end conductive region 202. In some embodiments, the body 252 of the second end conductive region 202 may be formed from a semiconductor substrate material (e.g., silicon or another semiconductor), from one or more metal layers separated by insulating materials, or any suitable arrangement of conductive materials. In some embodiments, the isolation portion 250 may be included in the intermediate conductive portion 206 (e.g., as one or more metal layers). In FIG. 2, the isolation portion 250 is shown as shaped substantially as a ring. This is simply an illustrative embodiment; the isolation portion 250 may be formed by a solid, or substantially solid region of a conductive material. In some embodiments, the shielding apparatus 200 may not include an isolation portion 250.

One or more connections 208 may extend through the second end conductive region 202 to electrically couple with the IC component 210. The connections 208 may provide power and/or ground lines to the IC component 210, and/or may route information-bearing signals to and/or from the IC component 210. Although two or fewer connections 208 may be illustrated in the accompanying drawings, this is simply for ease of illustration; any desired number of connections may be used in order to route the desired number of signals to and/or from the IC component 210. In some embodiments, one or more of the connections 208 may include a TSC. For example, in some embodiments, the connection 208 may be a TSV. Some TSVs may have diameters of approximately 10 to 80 nanometers, which may result in a very small aperture (typically not shown) through the second end conductive region 202, and thus may not substantially compromise the shielding ability of the shielding apparatus 200. In some embodiments, the connections 208 may include a through silicon coaxial via, which may take the form of a TSV surrounded by an isolated conductive shield (e.g., a metal sheath). In some such embodiments, the isolated conductive shield may be electrically connected to the second end conductive region 202. The connections 208 may be coupled with signal leads 260 which may route signals between the connections 208 and other portions of an IC device (e.g., other portions of the IC package 100).

In some embodiments, the signal leads 260 may include redistribution layer routing pathways. In some embodiments, the connections 208 may be coupled with filter circuitry (not shown) to prevent entry and/or egress of unwanted signals. For example, the connections 208 may be coupled with one or more capacitors in proximity to the location where the connections 208 enter the second end conductive region 202. In some embodiments, one or more dies proximate to the shielding apparatus 200 may include one or more metal-insulator-metal (MIM) capacitors formed in proximity to the connections 208. In some embodiments, a filter circuit may include MIM capacitors formed within a front metal stack of an IC die and shielded by a shielding apparatus 200. In some embodiments, a filter circuit may include MIM capacitors formed outside the shielding apparatus 200. In some embodiments, one or more MIM capacitors may be connected between one of the connections 208 and a reference plane. The reference plane may be formed, for example, in a redistribution layer (e.g., the redistribution layer 112). Such MIM capacitor filtering circuits may provide an external filtering arrangement for signals transmitted to and/or from the IC component 210 in the shielding apparatus 200.

The dimensions of the shielding apparatus 200 may be selected based on the dimensions of the IC component 210, the dimensions of the features surrounding the shielding apparatus 200 (e.g., one or more dies and/or redistribution layers, as discussed below) and/or the EMI frequencies to be shielded. For example, in some embodiments, the shielding apparatus 200 may be dimensioned to include RF front end circuitry, including one or more antenna coils, transistors, capacitors, etc. In some embodiments, the dimensions 240 and 242 of the first end conductive region 204 may each be approximately 200 microns. In some embodiments, the dimensions 240 and 242 of the first end conductive region 204 may each be approximately 500 microns. These dimensions are only examples, and any suitable dimensions may be used. Additionally, although the perimeters of the first end conductive region 204, the intermediate conductive region 206 and the second end conductive region 202 are shown as having an approximately square shape, the perimeters of these elements need not be square and may be any desired shape.

By surrounding the IC component 210 with conductive material (in the form of the first end conductive region 204, the intermediate conductive region 206, and the second end conductive region 202), the shielding apparatus 200 may shield EMI of certain frequencies. The shielding may include preventing EMI generated by the IC component 210 from interfering with other IC components (e.g., other IC components in the IC package 100) and/or preventing EMI generated by other IC components from interfering with the IC component 210. The particular EMI frequencies which may be shielded by the shielding apparatus 200 may depend on the geometry of the shielding apparatus 200. In particular, the shielding apparatus 200 may effectively shield frequencies whose corresponding wavelengths are too long to resonate in the shielding apparatus 200 or effectively pass through the shielding apparatus 200 into the volume 212 or out of the volume 212. The critical lengths at which EMI wavelengths become "too long" may depend on the spacing between different conductive elements within the shielding apparatus 200, with smaller spacings blocking shorter wavelengths, in accordance with known physical principles. Thus, the spacing and dimensions of various elements of the shielding apparatus 200 may be selected based on the desired wavelengths of EMI to be shielded, in accordance with known physical principles. Additionally, features such as conductive partitions (e.g., as discussed below with reference to FIG. 6) may be included in the shielding apparatus 200 to prevent the formation of standing waves in the volume 212.

For example, in some embodiments, the lateral and/or vertical spacing between various conductive elements in the shielding apparatus 200 (e.g., the spacing between pairs of adjacent vias 214) may be less than or equal to a smallest wavelength of EMI that is desired to be shielded. In some embodiments, the spacing between various conductive elements in the shielding apparatus 200 may be less than a smallest wavelength of EMI that is desired to be shielded divided by a factor (e.g., 5 or 10).

Other known approaches to calculating desired spacing may be used. For example, a cavity resonator may have various resonance modes determined in accordance with $$f = \frac{c}{2\varepsilon}\sqrt{\left(\left(\frac{m}{x}\right)^2 + \left(\frac{n}{y}\right)^2 + \left(\frac{p}{z}\right)^2\right)} \quad (1)$$

where n, m and p are the modes in the x, y and z dimensions and are based on the numbers of half-wavelengths. If the cavity is free air, the resonant frequency for mode 100 from this formula may be about 60 gigahertz at a length of 800 microns with a permittivity of three. This may resonate within the WiGig frequency band. Standing waves may be set up at one-quarter wavelengths.

In some embodiments, connections between the IC component 210 and circuitry external to the shielding apparatus 200 may extend from the IC component 210 through the intermediate conductive region 206 and/or the first end conductive region 204. Connections through the intermediate conductive region 206 may be particularly useful when the shielding apparatus 200 is used to shield circuitry on an active side of a die. For example, such connections may be useful when very high-frequency isolation is not a particular concern (and thus such connections may be more suitable to GSM applications than WiGig applications, for example). In another example, such connections may be useful when the track length between devices is desired to be minimized (Allowing, for example, an active side capacitor to be disposed very close to the intermediate conductive region 206). These connections may be provided through openings in the intermediate conductive region 206 and/or the first end conductive region 204. Such openings may allow problematic EMI frequencies to pass through the shielding apparatus 200 (depending upon the dimensions of the openings, as discussed above), but these frequencies may be addressed by filtering or the use of additional structures in the volume 212 (e.g., conductive partitions, as discussed below with reference to FIG. 6).

In some embodiments, signal traveling to and/or from the IC component 210 may be decoupled internal or external to the shielding apparatus 200, depending upon the desired direction of isolation. For example, external signals entering the shielding apparatus 200 may be isolated external to the shielding apparatus 200 so that less energy is passed through the shielding apparatus 200 and any circulating interference current is kept external. Internal signals exiting the shielding apparatus 200 may be isolated in internal to the shielding apparatus 200 to minimize energy passing through the shielding apparatus 200.

A number of different arrangements in which the shielding apparatus 200 is integrated into the IC package 100 are discussed below. An IC device may include any one or more of these arrangements, or any combination of features of various ones of these arrangements.

Figure 3:
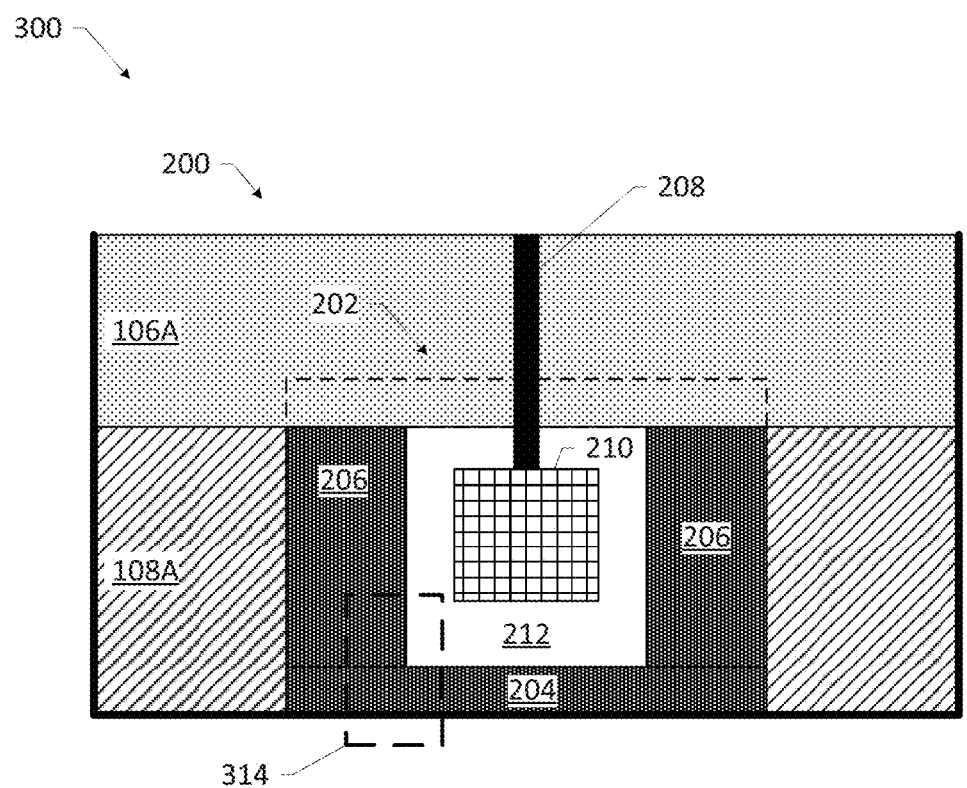
FIG. 3 is a side cross-sectional view of a first shielding apparatus arrangement, in accordance with some embodiments.

FIG. 3 is a side cross-sectional view of an arrangement 300 including the shielding apparatus 200, in accordance with some embodiments. In particular, FIG. 3 depicts a shielding apparatus 200 included in a single die. The embodiment of FIG. 3 will be discussed with reference to the first die 102A, but the arrangement 300 may be implemented in any desired die (e.g., the second die 102B).

In the arrangement 300, the first end conductive region 204 may be disposed in the front metal stack 108A of the first die 102A. The second end conductive region 202 may be disposed in the semiconductor portion 106A. In some embodiments, a substrate material included in the semiconductor substrate portion 106A-a may provide the second end conductive region 202. For example, the second end conductive region 202 may be provided by a region of silicon. In some embodiments, the second end conductive region 202 may be surrounded by deep well isolation (not shown).

In some embodiments, the second end conductive region 202 may include one or more TSCs (not shown) formed in the semiconductor portion 106A. These TSCs may be electrically coupled with the intermediate conductive region 206, and may be arranged to form one or more rings (e.g., as discussed below with reference to FIGS. 5 and 6). TSCs in these rings (or other arrangements) may be offset or otherwise arranged to have a desired spacing to shield undesired EMI frequencies. TSCs included in the second end conductive region 202 may be connected to conductive portions of a redistribution layer (e.g., the redistribution layer 112) or a metal stack of a die (e.g., the front metal stack 108A of the first die 102A). TSCs may advantageously be included in the semiconductor portion 106A to provide the second end conductive region 202 when the semiconductor material forming the semiconductor substrate portion 106A-a does not provide sufficient shielding for the IC component 210.

The intermediate conductive region 206 (which may include a plurality of vias 214, not shown) may be disposed between the first end conductive region 204 and the second end conductive region 202. The intermediate conductive region 206 may be electrically connected with the first end conductive region 204 and the second end conductive region 202. In particular, in some embodiments, the intermediate conductive region 206 may be electrically connected with the semiconductor substrate material of the semiconductor substrate portion 106A-a. As shown in FIG. 3, in some embodiments, the intermediate conductive region 206 may be disposed in the front metal stack 108A. In use, the IC component 210 may be disposed in the volume 212. The IC component 210 may be surrounded by the intermediate conductive region 206 (e.g., by a plurality of vias 214 included in the conductive region 206, as discussed below with reference to FIG. 4), the first end conductive region 204 and the second end conductive region 202.

A connection 208 may extend through the second end conductive region 202 (e.g., through an aperture in the second end conductive region 202) to couple with the IC component 210. In some embodiments, the connection 208 may include a TSC (e.g., a TSV). In some embodiments, the arrangement 300 may be used to route signals to and/or from the IC component 210 into the first die 102A. In particular, a conductive pathway may extend from the connection 208 (which may be, e.g., a TSC) through the redistribution layer 112, and back into the first die 102A. In some embodiments, the arrangement 300 may be used to route signals to and/or from the IC component 210 into the second die 102B. In particular, a conductive pathway may extend from the connection 208, through the redistribution layer 112, and to the front metal stack 108B or the back metal stack 104B of the second die 102B. Other conductive pathways may be provided instead of or in addition to these conductive pathways to route signals from the IC component 210 to any desired location.

Figure 4:
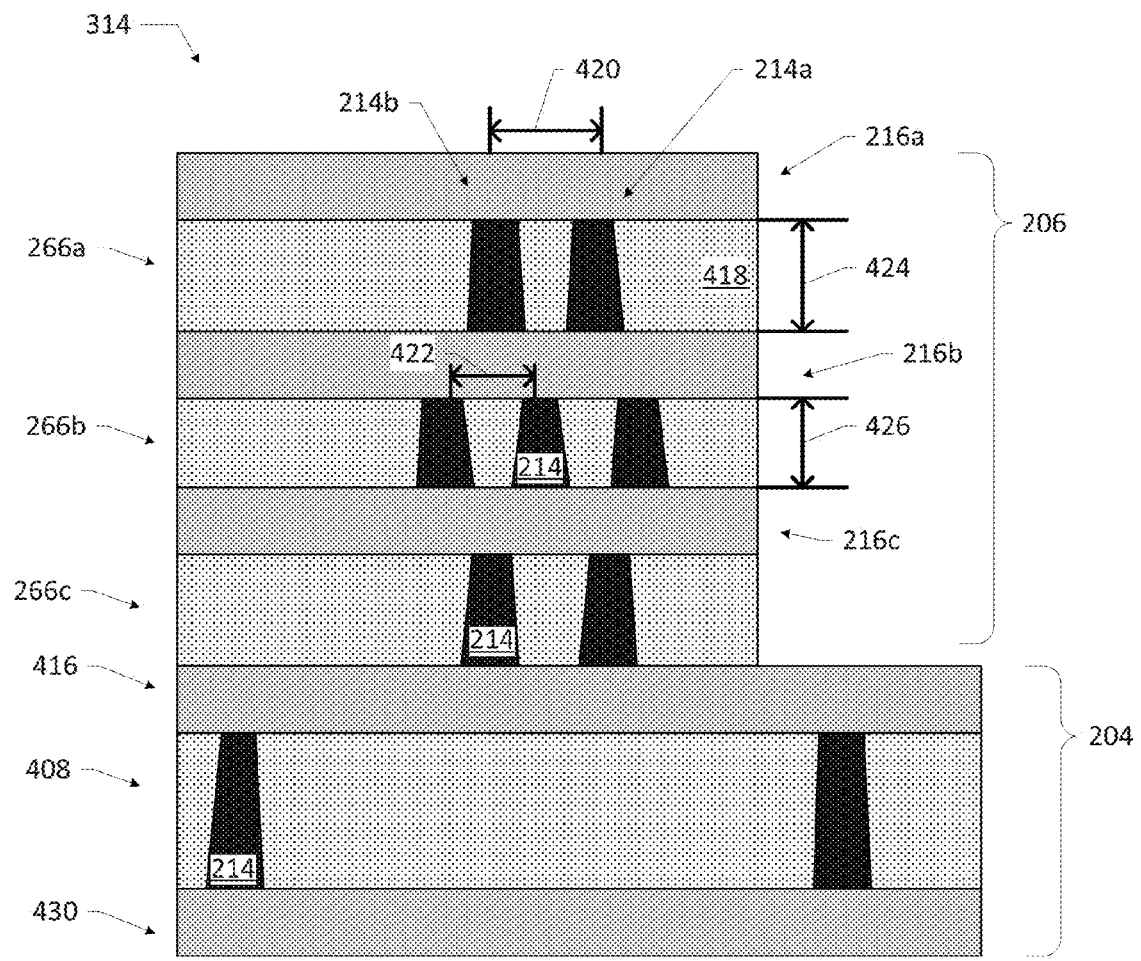
FIG. 4 is a side cross-sectional view of a portion of an intermediate conductive region and an end conductive region of a shielding apparatus, in accordance with some embodiments.

As noted above, the intermediate conductive region 206 may take any of a number of forms, such as a plurality of layers of vias coupled by metal layers. FIG. 4 is a side cross-sectional view of a portion 314 of the intermediate conductive region 206 and the first end conductive region 204 of the shielding apparatus 200, in accordance with some embodiments. The portion 314 is indicated in FIG. 3. In the portion 314, the intermediate conductive region 206 may include via layers 266a, 266b and 266c. The number and arrangement of the via layers 266a, 266b and 266c and the vias 214 arranged therein are simply illustrative, and any number of via layers and/or arrangement of vias 214 may be used. Each of the via layers 266a, 266b and 266c may include one or more vias 214. In some embodiments, a via layer may include two or more vias 214, and these vias 214 may be arranged in a ring within a via layer (e.g., as discussed below with reference to FIGS. 5 and 6). For example, the via 214a of the via layer 266a may be part of an inner ring of vias, and the via 214b of the via layer 266a may be part of an outer ring of vias. In some embodiments, multiple vias 214 may be arranged in a ring but distributed between multiple via layers (e.g., as discussed below with reference to FIGS. 5 and 6).

Vias 214 in different via layers may have different lateral spacing. For example the spacing 420 in the via layer 266a may be different from the spacing 422 in the via layer 266b. Vias 214 in the same via layer may have different lateral spacing. Vias 214 in different via layers may have different heights. For example, the height 424 of the vias 214 in the via layer 266a may be different from the height 426 of the vias 214 in the via layer 266b. The vias 214 in different via layers may be aligned in any desired arrangement (e.g., affect with reference to vias 214 in adjacent layers, as depicted in FIG. 4). In some embodiments, the vias 214 within one via layer and/or across multiple via layers may be spaced relative to one another to shield incoming or outgoing EMI (e.g., of particular frequencies).

The intermediate conductive region 206 may include metal layers 216a, 216b and 216c. The number and arrangement of the metal layers 216a, 216b and 216c are simply illustrative, and any number of metal layers may be used. The heights of different metal layers may be the same, or may be different. The heights of these layers may be adjusted to adjust the spacing between the vias 214 (in addition to the lateral spacing discussed above). In some embodiments, the vias 214 within one via layer and/or across multiple via layers may be spaced relative to one another to shield incoming or outgoing EMI. In some embodiments, the metal layers (e.g., the metal layers 216a, 216b and 216c) may be spaced relative to one another (and/or relative to the vias 214) to shield incoming or outgoing EMI. The lateral dimensions of each of the metal layers 216a, 216b and 216c may be different (e.g., the lateral dimension of the metal layer 216a may be larger than the lateral dimension of the metal layer 216b, which may be larger than the lateral dimension of the metal layer 216c). These and other dimensions may be constrained by semiconductor fabrication process rules and/or other features (such as adjacent routing in the same layer).

The first end conductive region 204 may include one or more metal layers and/or one or more via layers, in various embodiments. As shown in FIG. 4, the first end conductive region 204 may include metal layers 416 and 430 and a via layer 408. In other embodiments, the first end conductive region 204 may be formed of a substantially solid conductive material. For example, in some embodiments, the first end conductive region 204 may include a single metal layer or a set of adjacent metal layers. As discussed above with reference to the metal layers and via layers of the intermediate conductive region 206, metal layers and/or via layers included in the first end conductive region 204 may have varying thicknesses, heights, via spacings, and other dimensions. An electrically insulating material 418 (such as a dielectric material) may fill in areas between conductive elements of the intermediate conductive region 206 and the first end conductive region 204.

As discussed above, vias 214 in the intermediate conductive region 206 may be arranged in any of a number of ways to aid in shielding the IC component 210. In some embodiments, vias 214 included in the intermediate conductive region 206 may be arranged in one or more rings surrounding the IC component 210. These rings may comprise vias wholly within a single via layer or vias distributed across multiple different via layers.

Figure 5:
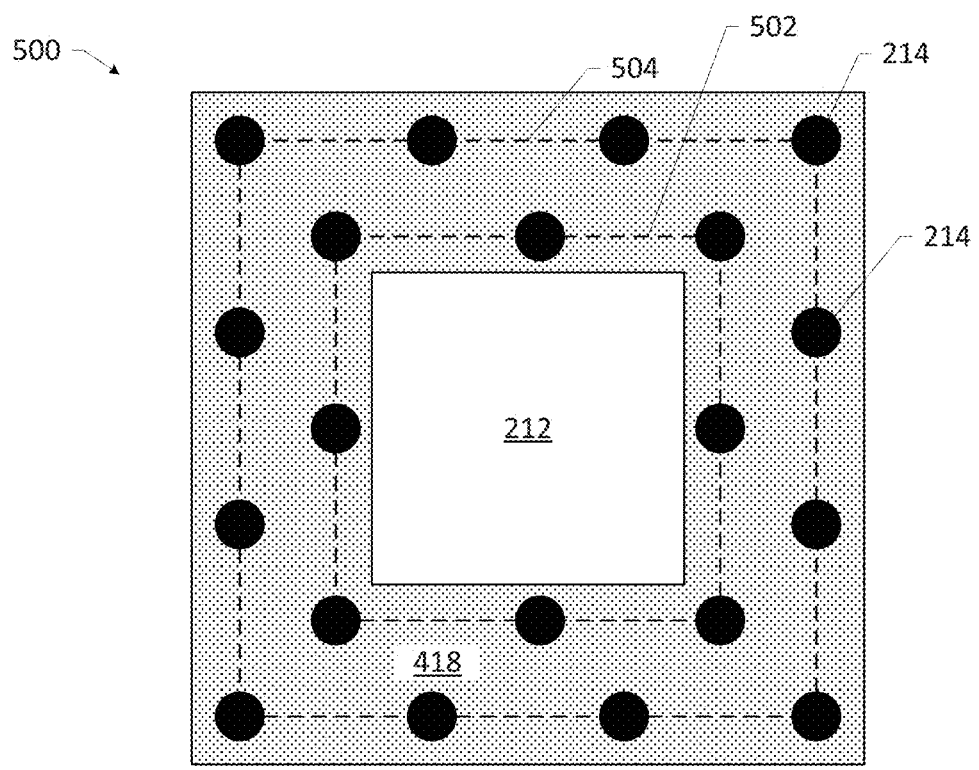
FIG. 5 is a top cross-sectional view of an arrangement of vias in multiple rings, in accordance with some embodiments.

FIG. 5 is a top cross-sectional view of an arrangement 500 of vias 214 in multiple rings, in accordance with some embodiments. In FIG. 5, an electrically insulating material 418 may surround the vias 214 arranged in an outer ring 504 and the vias 214 arranged in an inner ring 502. Each of the rings 502 and 504 may surround the volume 212. The arrangement 500 depicts an embodiment in which the outer ring 504 and the inner ring 502 are wholly included within a single via layer; however, in some embodiments, one or more of the vias 214 of the inner ring 502 and/or the outer ring 504 may be included in different via layers. Although two rings are illustrated in FIG. 5, three or more rings may be included in various embodiments. In some embodiments, the vias 214 of the intermediate conductive region 206 may be arranged in a single ring. Vias 214 of different rings may be offset from each other (e.g., as illustrated in FIG. 5 for the rings 502 and 504) to reduce the distance between neighboring pairs of vias and thus block EMI of higher frequencies.

Figure 6:
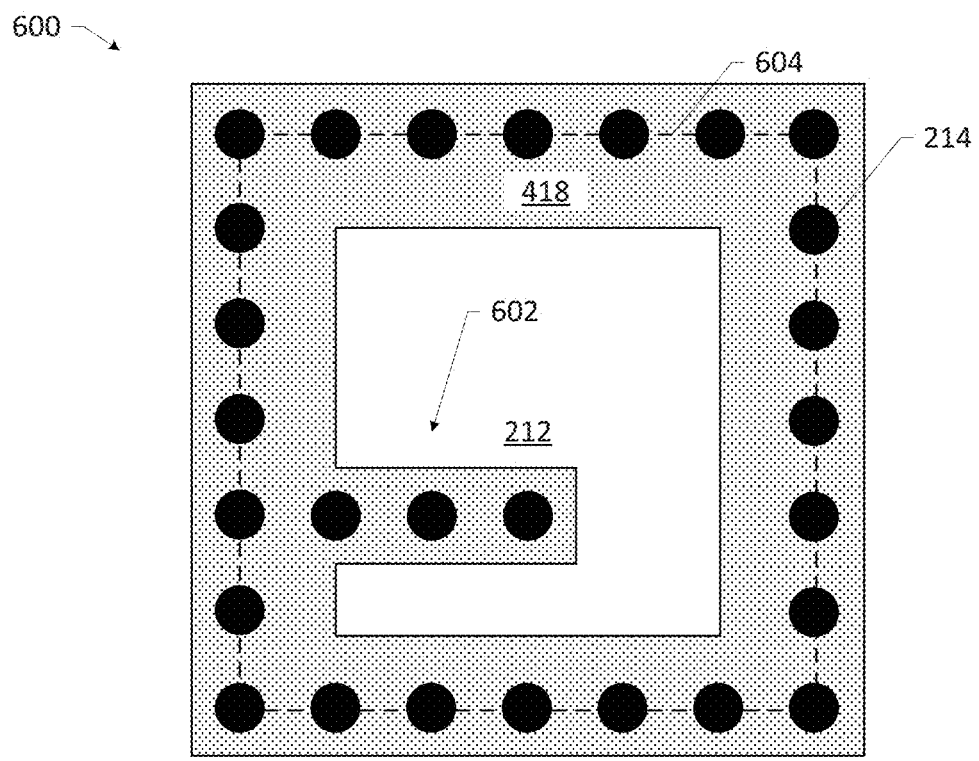
FIG. 6 is a top cross-sectional view of an arrangement of vias including a conductive partition, in accordance with some embodiments.

In some embodiments, vias 214 of the intermediate conductive region 206 may be arranged to form one or more non-ring features. FIG. 6 is a top cross-sectional view of an arrangement 600 of vias 214 including a ring 604 and a conductive partition 602, in accordance with some embodiments. As noted above, the vias 214 may be surrounded by the electrically insulating material 418. The conductive partition 602 is depicted as including one or more vias 214 arranged to extend into the volume 212 surrounded by the ring 604. The conductive partition 602 may suppress the formation of standing waves in the volume 212 (e.g., waves for which the distance between conductors in the shielding apparatus 200 is a multiple of the half-wavelength). In some embodiments, the conductive partition 602 may not be formed with vias 214, but with a solid conductive material, multiple layers of solid conductive material, or any other suitable structure. Although the conductive partition 602 is depicted as substantially linear, a conductive partition may take any desired shape, such as a curved shape or a closed shape. In some embodiments, the conductive partition 602 (and possibly additional conductive partitions) may extend all the way across the ring 604, partitioning the volume 212 into two (or more) regions. In some embodiments, two or more conductive partitions may be included in a shielding apparatus 200. In some embodiments, no conductive partitions may be included in a shielding apparatus 200.

The embodiments described above for the intermediate conductive region 206 and various arrangements of the vias 214 may be included in any of the embodiments of the shielding apparatus 200 disclosed herein. For example, any of the embodiments of the intermediate conductive region 206 and the vias 214 may be included in the arrangement 300 (FIG. 3) discussed above, or in the arrangements 700, 800 and 900 (FIGS. 7, 8 and 9, respectively) discussed below.

Figure 7:
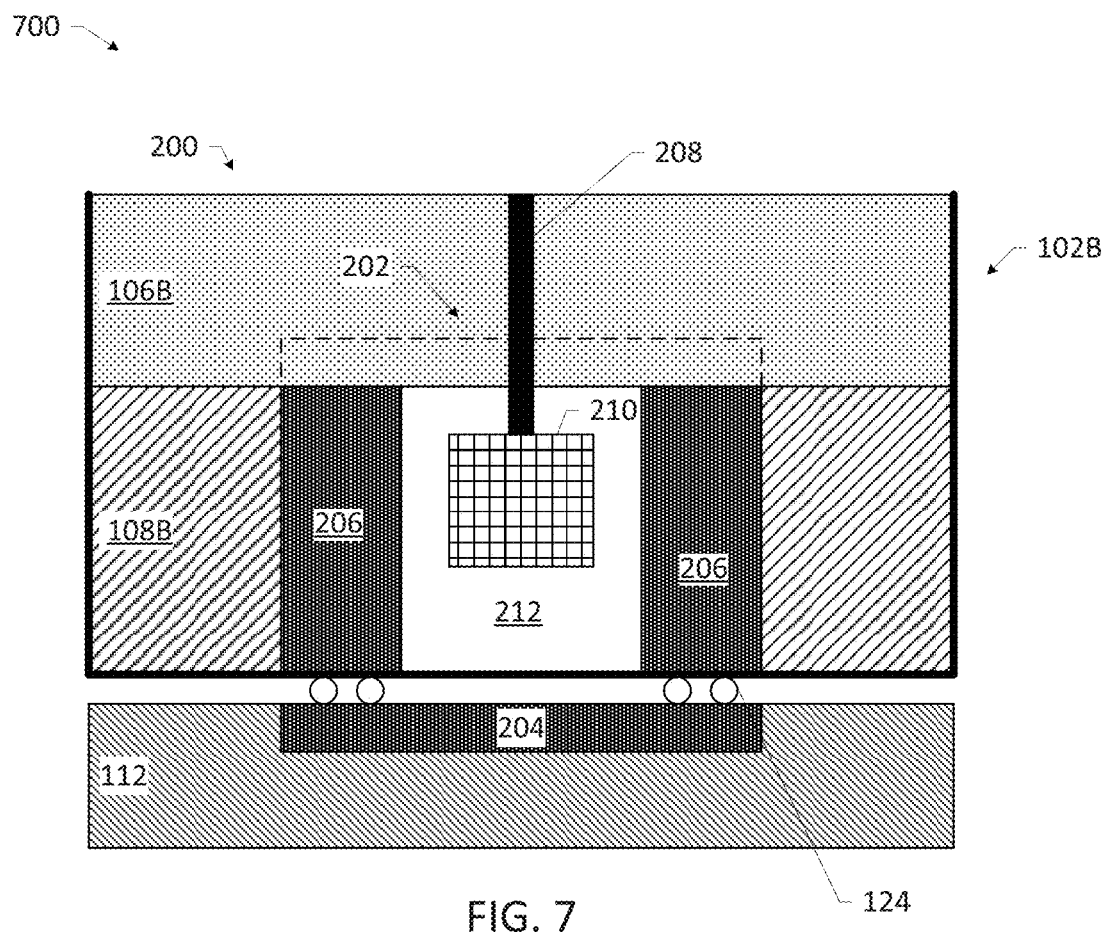
FIG. 7 is a side cross-sectional view of a second shielding apparatus arrangement, in accordance with some embodiments.

FIG. 7 is a side cross-sectional view of an arrangement 700 including the shielding apparatus 200, in accordance with some embodiments. In particular, FIG. 7 depicts a shielding apparatus 200 having portions distributed between a redistribution layer and a die adjacent to the redistribution layer. The embodiment of FIG. 7 will be discussed with reference to the redistribution layer 112 and the second die 102B, but the arrangement 700 may be implemented in any desired die (e.g., one or more dies "higher up" in the IC package 100).

In the arrangement 700, the first end conductive region 204 may be disposed in the redistribution layer 112 between the first die 102A and the second die 102B. The first end conductive region 204 in the arrangement 700 may take any of the forms discussed above for the first end conductive region 204 in the arrangement 300 (FIG. 3), for example. The second end conductive region 202 may be disposed in the semiconductor portion 106B. In some embodiments, the substrate material forming the semiconductor substrate portion 106B-a may provide the second end conductive region 202. For example, the second end conductive region 202 may be provided by a region of silicon. In some embodiments, the second end conductive region 202 may be surrounded by deep well isolation (not shown). In some embodiments, the second end conductive region 202 may include one or more TSCs formed in the semiconductor portion 106B (e.g., in accordance with any of the embodiments discussed above for the second end conductive region 202 of the arrangement 300 of FIG. 3).

The intermediate conductive region 206 (which may include a plurality of vias 214, not shown) may be disposed between the first end conductive region 204 and the second end conductive region 202. As shown in FIG. 7, in some embodiments, the intermediate conductive region 206 may be disposed in the front metal stack 108B. In some embodiments, the intermediate conductive region 206 of the arrangement 700 may take any of the forms discussed above with reference to FIG. 4 (e.g., one or more layers of vias separated by metal layers). In some embodiments, as shown in FIG. 7, the intermediate conductive region 206 may include one or more micro bumps 124, which may couple the first end conductive region 204 and the intermediate conductive region 206. The micro bumps 124 may be arranged in any of the ways discussed herein with reference to the vias 214. In particular, individual micro bumps 124 may be spaced relative to one another to shield incoming or outgoing EMI. The pattern of micro bumps 124 may be the same as the pattern of vias 214, or may have a different pattern.

In use, the IC component 210 may be disposed in the volume 212. The IC component 210 may be surrounded by the intermediate conductive region 206 (e.g., by a plurality of vias 214 included in the intermediate conductive region 206), the first end conductive region 204 and the second end conductive region 202. A connection 208 may extend through the second end conductive region 202 (e.g., through an aperture in the second end conductive region 202) to couple with the IC component 210. In some embodiments, the connection 208 may include a TSC (e.g., a TSV).

In some embodiments, the arrangement 700 may be used to route signals to and/or from the IC component 210 into the first die 102A. In particular, a conductive pathway may extend from the connection 208 (which may be, for example, a TSC), through the redistribution layer 112, and back into the first die 102A. In some embodiments, the arrangement 700 may be used to route signals to and/or from the IC component 210 into the second die 102B. In particular, a conductive pathway may extend from the connection 208 to the front metal stack 108B or to the back metal stack 104B of the second die 102B. Other conductive pathways may be provided instead of or in addition to these conductive pathways to route signals from the IC component 210 to any desired location.

Figure 8:
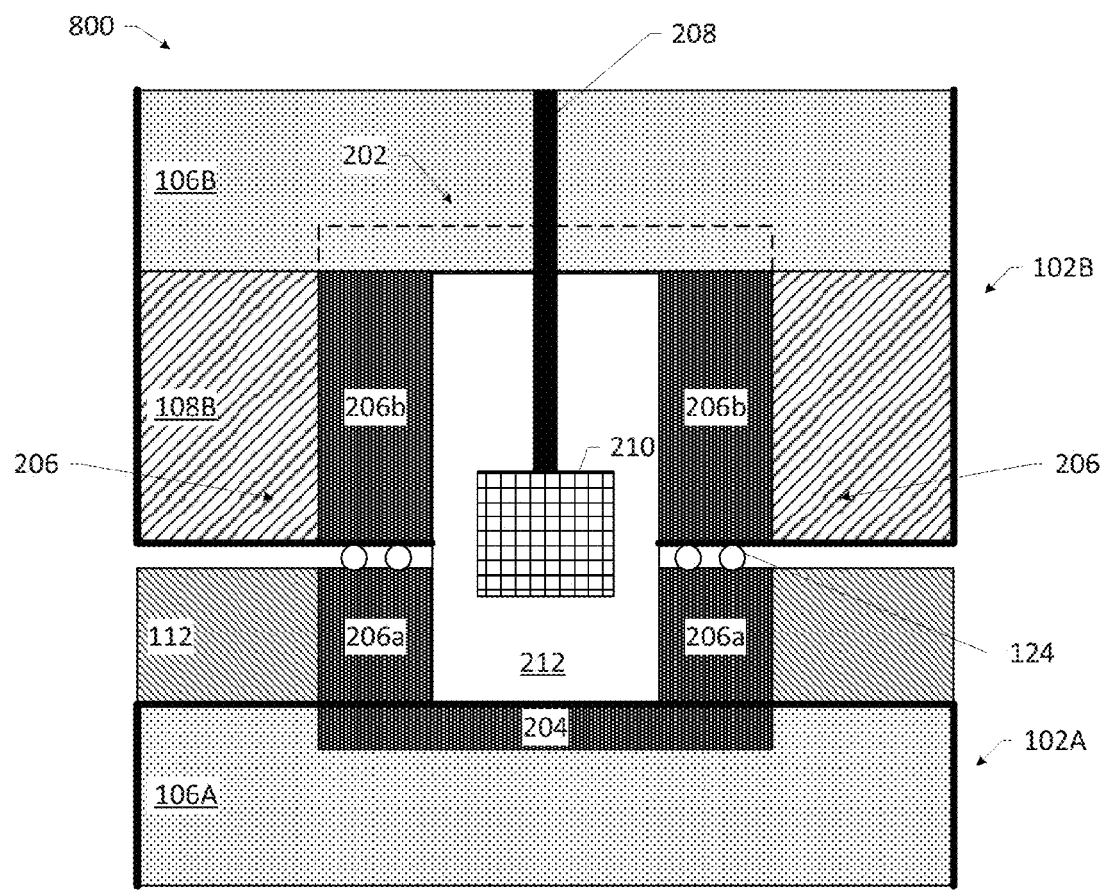
FIG. 8 is a side cross-sectional view of a third shielding apparatus arrangement, in accordance with some embodiments.

FIG. 8 is a side cross-sectional view of an arrangement 800 including the shielding apparatus 200, in accordance with some embodiments. In particular, FIG. 8 depicts a shielding apparatus 200 having portions distributed between two dies and a redistribution layer disposed between the dies. The embodiment of FIG. 8 will be discussed with reference to the first die 102A, the redistribution layer 112 and the second die 102B, but the arrangement 800 may be implemented in any desired pair of dies separated by a redistribution layer.

In the arrangement 800, the first end conductive region 204 may be disposed in the semiconductor portion 106A of the first die 102A. The first end conductive region 204 in the arrangement 800 may take any of the forms discussed above for the second end conductive region 202 in the arrangement 300 (FIG. 3), for example. In some embodiments, the first end conductive region 204 may be provided by a region of silicon. In some embodiments, the first end conductive region 204 may be surrounded by deep well isolation (not shown). The second end conductive region 202 may be disposed in the semiconductor portion 106B of the second die 102B. In some embodiments, the substrate material forming the semiconductor substrate portion 106B-a may provide the second end conductive region 202. For example, the second end conductive region 202 may be provided by a region of silicon. In some embodiments, the second end conductive region 202 may be surrounded by deep well isolation (not shown). In some embodiments, the second end conductive region 202 may include one or more TSCs formed in the semiconductor portion 106B (e.g., in accordance with any of the embodiments discussed above for the second end conductive region 202 of the arrangement 300 of FIG. 3).

The intermediate conductive region 206 (which may include a plurality of vias 214, not shown) may be disposed between the first end conductive region 204 and the second end conductive region 202. As shown in FIG. 8, in some embodiments, the intermediate conductive region 206 may include a portion 206a disposed in the redistribution layer 112 and a portion 206b disposed in the front metal stack 108B of the second die 102B. In some embodiments, the intermediate conductive region 206 (e.g., one or more of the portions 206a and 206b) of the arrangement 800 may take any of the forms discussed above with reference to FIG. 4 (e.g., one or more layers of vias separated by metal layers).

In some embodiments, as shown in FIG. 8, the intermediate conductive region 206 may include one or more micro bumps 124, which may couple the intermediate conductive region portion 206a and the intermediate conductive region portion 206b. The micro bumps 124 may be arranged in any of the ways discussed herein with reference to the vias 214. In particular, individual micro bumps 124 may be spaced relative to one another to shield incoming or outgoing EMI. The pattern of micro bumps 124 may be the same as the pattern of vias 214, or may have a different pattern.

In use, the IC component 210 may be disposed in the volume 212. The IC component 210 may be surrounded by the intermediate conductive region 206 (e.g., by a plurality of vias 214 included in the intermediate conductive region 206), the first end conductive region 204 and the second end conductive region 202. A connection 208 may extend through the second end conductive region 202 (e.g., through an aperture in the second end conductive region 202) to couple with the IC component 210. In some embodiments, the connection 208 may include a TSC (e.g., a TSV).

In some embodiments, the arrangement 800 may be used to route signals to and/or from the IC component 210 into the first die 102A. In particular, a conductive pathway may extend from the connection 208 (which may be, e.g., a TSC) into the redistribution layer 112, and into the first die 102A. In some embodiments, the arrangement 800 may be used to route signals to and/or from the IC component 210 into the second die 102B. In particular, a conductive pathway may extend from the connection 208 to the front metal stack 108B or the back metal stack 104B of the second die 102B. Other conductive pathways may be provided instead of or in addition to these conductive pathways to route signals from the IC component 210 to any desired location.

In the arrangement 800, the shielding apparatus 200 may span multiple dies (in particular, the first die 102A and the second die 102B). In some such embodiments, the IC component 210 in such an arrangement may be a coupling point between circuits formed in the first die 102A (e.g., in the active components portion 106A-6) and circuits formed in the second die 102B (e.g., in the active components portion 106B-b). By providing this coupling point within the shielding apparatus 200, the coupling point may be electrically isolated from EMI from the first die 102A, the second die 102B, and any other surrounding circuitry.

Figure 9:
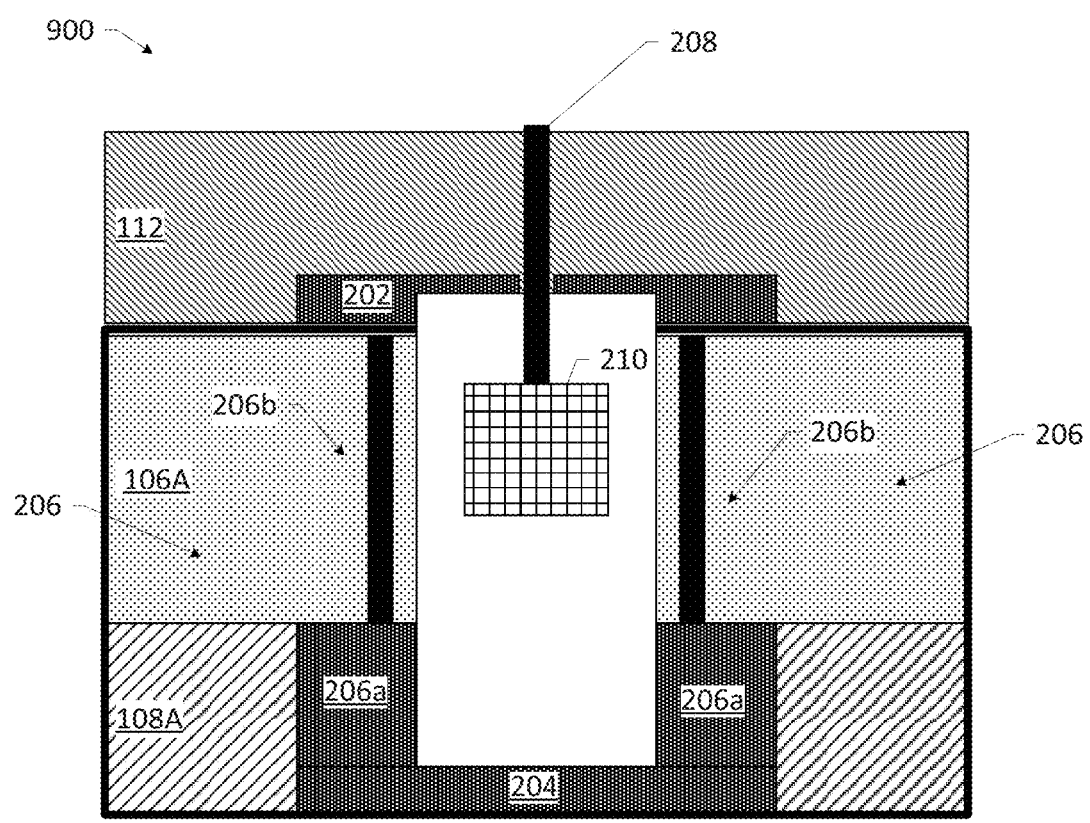
FIG. 9 is a side cross-sectional view of a fourth shielding apparatus arrangement, in accordance with some embodiments.

FIG. 9 is a side cross-sectional view of an arrangement 900 including the shielding apparatus 200, in accordance with some embodiments. In particular, FIG. 9 depicts a shielding apparatus 200 having portions distributed between a die and a redistribution layer disposed adjacent to the die. The embodiment of FIG. 9 will be discussed with reference to the first die 102A and the redistribution layer 112, but the arrangement 900 may be implemented in any die adjacent to a redistribution layer.

In the arrangement 900, the first end conductive region 204 may be disposed in the front metal stack 108A of the first die 102A. The first end conductive region 204 in the arrangement 900 may take any of the forms discussed above for the first end conductive region 204 in the arrangement 300 (FIG. 3), for example. The second end conductive region 202 may be disposed in the redistribution layer 112. The second end conductive region 202 in the arrangement 900 may take any of the forms discussed above for the first end conductive region 204 in the arrangement 300 (FIG. 3), for example. In particular, in some embodiments, the first end conductive region 204 and the second end conductive region 202 may each include one or more layers of vias and/or one or more metal layers.

The intermediate conductive region 206 (which may include a plurality of vias 214, not shown) may be disposed between the first end conductive region 204 and the second end conductive region 202. As shown in FIG. 9, in some embodiments, the intermediate conductive region 206 may include a portion 206a disposed in the front metal stack 108A of the first die 102A and a portion 206b disposed in the semiconductor portion 106A of the first die 102A. In some embodiments, the portion 206a of the arrangement 900 may take any of the forms discussed above with reference to FIG. 4 (e.g., one or more layers of vias separated by metal layers). In some embodiments, the portion 206b may include one or more TSCs, such as one or more TSVs. TSCs of the portion 206b may be arranged in accordance with any of the arrangements discussed above with reference to FIGS. 5 and 6, for example. In particular, in some embodiments, the portion 206b may include one or more rings of TSVs. The portion 206a may also include one or more rings of vias 214. The arrangement of TSCs in the portion 206b and the arrangement of vias 214 in the portion 206a may be selected to shield incoming or outgoing EMI.

In use, the IC component 210 may be disposed in the volume 212. The volume 212 may be partially disposed in the semiconductor portion 106A; the material of the semiconductor portion 106A may be etched away by a suitable process. The IC component 210 may be surrounded by the intermediate conductive region 206 (e.g., by a plurality of vias 214 included in the intermediate conductive region 206), the first end conductive region 204 and the second end conductive region 202. A connection 208 may extend through the second end conductive region 202 (e.g., through an aperture in the second end conductive region 202) to couple with the IC component 210. In some embodiments, the connection 208 may include a TSC (e.g., a TSV).

In some embodiments, the arrangement 900 may be used to route signals to and/or from the IC component 210 into the first die 102A. In particular, a conductive pathway may extend from the connection 208 (which may be, e.g., a TSC) through the redistribution layer 112, into the second die 102B, and back into the first die 102A. In some embodiments, the arrangement 900 may be used to route signals to and/or from the IC component 210 into the second die 102B. In particular, a conductive pathway may extend from the connection 208 through the redistribution layer 112 into the second die 102B. Other conductive pathways may be provided instead of or in addition to these conductive pathways to route signals from the IC component 210 to any desired location.

Figure 10:
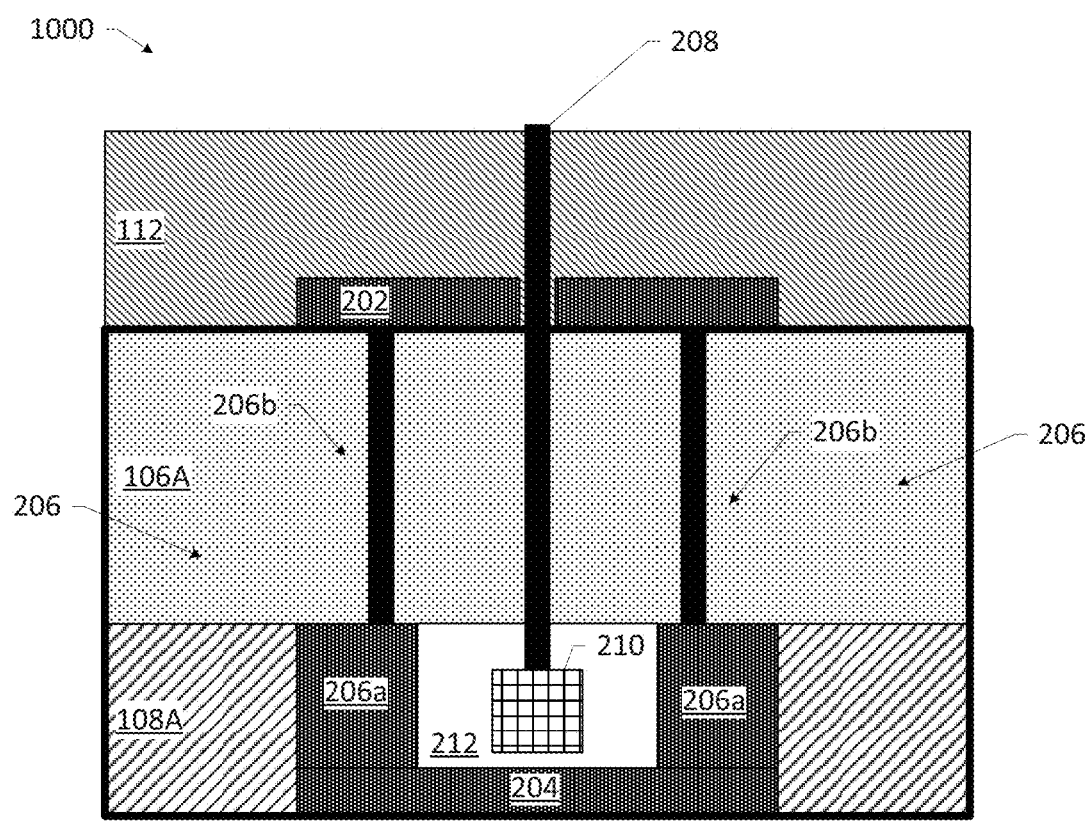
FIG. 10 is a side cross-sectional view of a fifth shielding apparatus arrangement, in accordance with some embodiments.

FIG. 10 is a side cross-sectional view of an arrangement 1000 including the shielding apparatus 200, in accordance with some embodiments. In particular, FIG. 10 depicts a shielding apparatus 200 having portions distributed between a die and a redistribution layer disposed adjacent to the die. The embodiment of FIG. 10 will be discussed with reference to the first die 102A and the redistribution layer 112, but the arrangement 1000 may be implemented in any die adjacent to a redistribution layer.

In the arrangement 1000, the first end conductive region 204 may be disposed in the front metal stack 108A of the first die 102A. The first end conductive region 204 in the arrangement 1000 may take any of the forms discussed above for the first end conductive region 204 in the arrangement 300 (FIG. 3), for example. The second end conductive region 202 may be disposed in the redistribution layer 112. The second end conductive region 202 in the arrangement 1000 may take any of the forms discussed above for the first end conductive region 204 in the arrangement 300 (FIG. 3), for example. In particular, in some embodiments, the first end conductive region 204 and the second end conductive region 202 may each include one or more layers of vias and/or one or more metal layers.

The intermediate conductive region 206 (which may include a plurality of vias 214, not shown) may be disposed between the first end conductive region 204 and the second end conductive region 202. As shown in FIG. 10, in some embodiments, the intermediate conductive region 206 may include a portion 206a disposed in the front metal stack 108A of the first die 102A and a portion 206b disposed in the semiconductor portion 106A of the first die 102A. In some embodiments, the portion 206a of the arrangement 1000 may take any of the forms discussed above with reference to FIG. 4 (e.g., one or more layers of vias separated by metal layers). In some embodiments, the portion 206b may include one or more TSCs, such as one or more TSVs. TSCs of the portion 206b may be arranged in accordance with any of the arrangements discussed above with reference to FIGS. 5 and 6, for example. In particular, in some embodiments, the portion 206b may include one or more rings of TSVs. The portion 206a may also include one or more rings of vias 214. The arrangement of TSCs in the portion 206b and the arrangement of vias 214 in the portion 206a may be selected to shield incoming or outgoing EMI.

In use, the IC component 210 may be disposed in the volume 212. The IC component 210 may be disposed in the front metal stack 108A, and surrounded by the intermediate conductive region 206 (e.g., by the intermediate conductive region portion 206a), the first end conductive region 204 and the second end conductive region 202. In contrast with the arrangement 900 of FIG. 9, none of the semiconductor portion 106A may be etched away in the arrangement 1000 in order to form the volume 212. A connection 208 may extend through the second end conductive region 202 (e.g., through an aperture in the second end conductive region 202) to couple with the IC component 210. In some embodiments, the connection 208 may include a TSC (e.g., a TSV).

In some embodiments, the arrangement 1000 may be used to route signals to and/or from the IC component 210 into the first die 102A. In particular, a conductive pathway may extend from the connection 208 (which may be, e.g., a TSC) through the redistribution layer 112, into the second die 102B, and back into the first die 102A. In some embodiments, the arrangement 1000 may be used to route signals to and/or from the IC component 210 into the second die 102B. In particular, a conductive pathway may extend from the connection 208 through the redistribution layer 112 into the second die 102B. Other conductive pathways may be provided instead of or in addition to these conductive pathways to route signals from the IC component 210 to any desired location.

Figure 11:
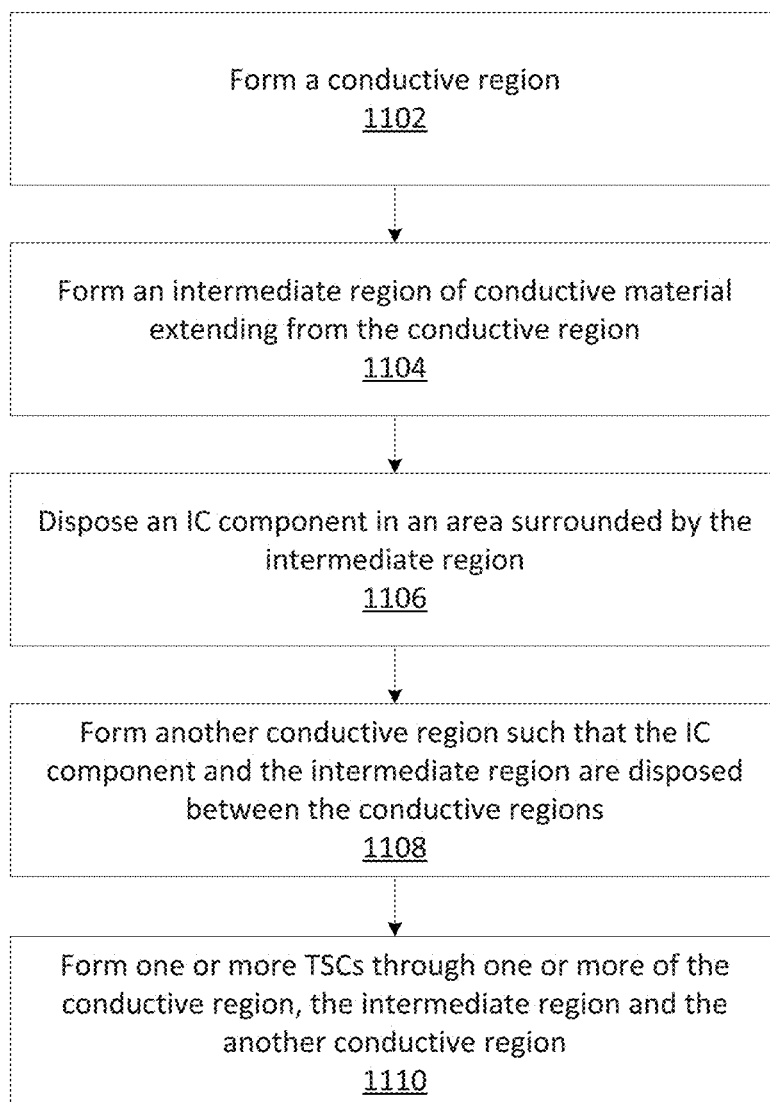
FIG. 11 is a flow diagram of an illustrative process for shielding an IC component, in accordance with some embodiments.

FIG. 11 is a flow diagram of an illustrative process 1100 for shielding an IC component, in accordance with some embodiments. Operations of the process 1100 may be discussed below with reference to the shielding apparatus 200, but the operations of the process 1100 may be applied in any of a number of IC component shielding applications. For example, the process 1100 may be used to shield an IC component in accordance with any of the arrangements including shielding apparatuses disclosed herein. Although various operations of the process 1100 may be described as discrete operations, any one or more operations may be subdivided and/or combined as desired. The operations may be performed in any suitable order, and various operations may be omitted and/or repeated as desired.

At the operation 1102, a conductive region may be formed. In some embodiments, the conductive region may take the form of any of the second end conductive regions 202 discussed herein. For example, in some embodiments, the conductive region of the operation 1102 may be formed in a semiconductor portion of a die (e.g., as discussed above with reference to FIGS. 3, 7 and 8), in a redistribution layer (e.g., as discussed above with reference to FIGS. 9 and 10), or in any other suitable location.

At the operation 1104, an intermediate region of conductive material may be formed. The intermediate region of conductive material may extend from the conductive region of the operation 1102. In some embodiments, the intermediate region of conductive material may take the form of any of the intermediate conductive regions 206 discussed herein. For example, in some embodiments, the intermediate region of the operation 1104 may be formed (at least partially) in a front metal stack of a die (e.g., as discussed above with reference to FIGS. 3, 7, 9 and 10), in a redistribution layer (e.g., as discussed above with reference to FIG. 8), in a semiconductor portion of a die (e.g., as discussed above with reference to FIG. 9), or in any other suitable location. In some embodiments, the intermediate region may include a plurality of vias, which may extend from the conductive region of the operation 1102. The plurality of vias may take the form of any of the vias 214 discussed above (e.g., arranged in a ring and/or with one or more conductive partitions).

At the operation 1106, an IC component may be disposed in a volume surrounded by the intermediate region. The IC component of the operation 1106 may include any of the IC components 210 discussed herein, for example (e.g., radio, clock or other EMI sensitive components). In some embodiments, the IC component of the operation 1106 may be formed in place in the volume 212 of the shielding apparatus 200.

At the operation 1108, another conductive region may be formed. The another conductive region may be formed at the operation 1108 such that the IC component (of the operation 1106) in and the intermediate region (of the operation 1104) may be disposed between the conductive regions of the operations 1102 and 1108. In some embodiments, the another conductive region may take the form of any of the first end conductive regions 204 discussed herein. For example, in some embodiments, the another conductive region of the operation 1108 may be formed in a front metal stack of a die (e.g., as discussed above with reference to FIGS. 3, 9 and 10), in a redistribution layer (e.g., as discussed above with reference to FIG. 7), in a back metal stack of a die (e.g., as discussed above with reference to FIG. 8), or in any other suitable location. The conductive regions of the operations 1102 and 1108, and the intermediate region of the operation 1104, may surround the IC component of the operation 1106 and may be formed and dimensioned so as to shield incoming or outgoing EMI.

At the operation 1110, one or more TSCs may be formed, extending through one or more conductor (e.g., the conductive region of the operation 1102, the intermediate region of conductive material of the operation 1104 or the another conductive region of the operation 1108). The one or more TSCs formed at the operation 1110 may be coupled with the IC component (of the operation 1106) to transmit signals to and/or from the IC component. In some embodiments, the one or more TSCs may take the form of any of the connections 208 discussed herein. The process 1100 may then end.

Figure 12:
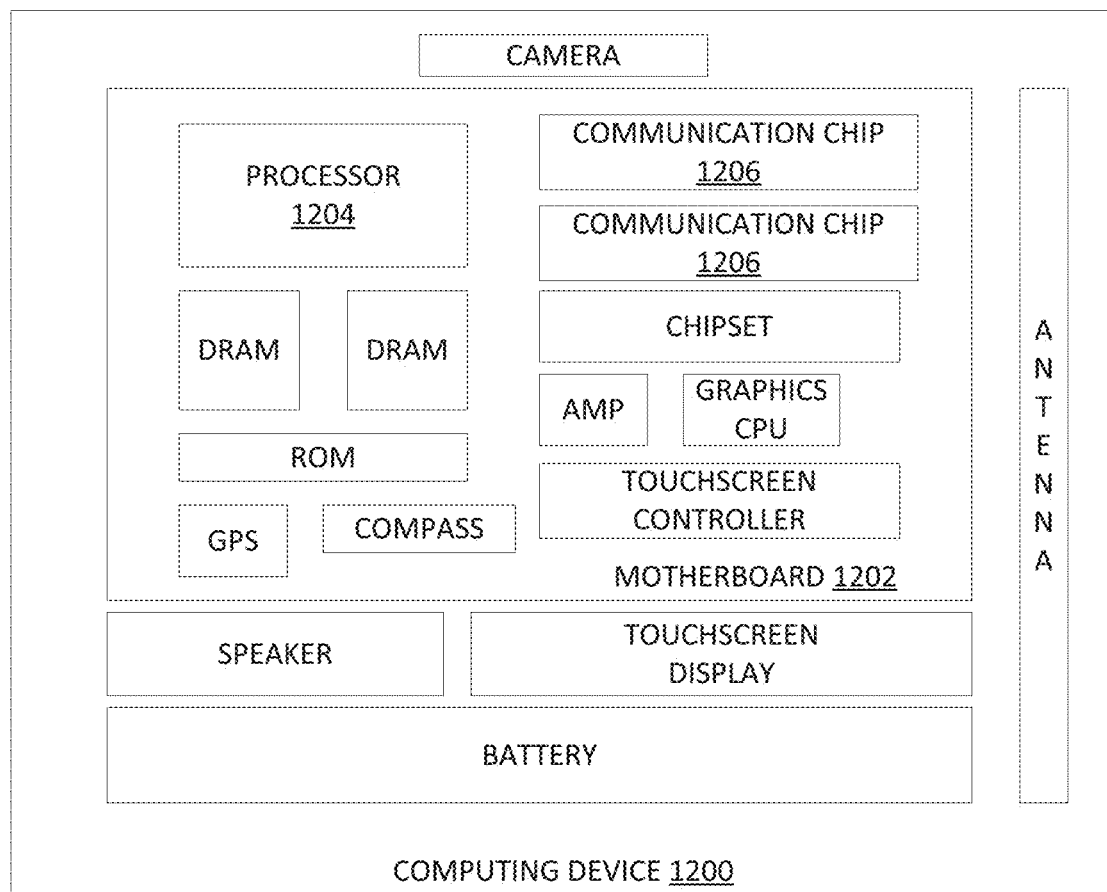
FIG. 12 is a block diagram of an example computing device that may include one or more of any of the shielding apparatuses disclosed herein.

Embodiments of the present disclosure may be implemented into a system using any suitable hardware that may benefit from the shielding apparatuses and techniques disclosed herein. FIG. 12 schematically illustrates a computing device 1200, in accordance with some implementations, which may include one or more shielding apparatuses. The computing device 1200 may be, for example, a mobile communication device or a desktop or rack-based computing device. The computing device 1200 may house a board such as motherboard 1202. The motherboard 1202 may include a number of components, including (but not limited to) a processor 1204 and at least one communication chip 1206. Any of the components discussed herein with reference to the computing device 1200 may be arranged in an IC package (such as the IC package 100 of FIG. 1), and one or more shielding apparatuses may be included within dies, between stacked dies and/or between laterally adjacent dies and/or in any desired location in an IC package. The processor 1204 may be physically and electrically coupled to the motherboard 1202. In some implementations, the at least one communication chip 1206 may also be physically and electrically coupled to the motherboard 1202. In further implementations, the communication chip 1206 may be part of the processor 1204.

Depending on its applications, the computing device 1200 may include other components that may or may not be physically and electrically coupled to the motherboard 1202. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disc (CD), digital versatile disc (DVD), and so forth). In various embodiments, shielding apparatuses of the present disclosure may be disposed between, on, or around any of these components.

The communication chip 1206 and the antenna may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1206 may operate in accordance with a GSM, General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), UTRAN, or Evolved UTRAN (E-UTRAN). The communication chip 1206 may operate in accordance with CDMA, Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others. In some embodiments, the communication chip 1206 may support wired communications. For example, the computing device 1200 may include one or more wired servers.

The processor 1204 and/or the communication chip 1206 of the computing device 1200 may include one or more dies or other components in an IC package. The term "processor" may refer to any device or portion of a device that processes electronic data from registers and/or memory to transform that electronic data into other electronic data that may be stored in registers and/or memory. as discussed above, these components may be stacked and/or laterally arranged in any desired configuration, and shielding apparatuses may be disposed in, on or around any such component.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data. In some embodiments, the shielding apparatuses may be implemented in a high-performance computing device.

The following paragraphs provide examples of the embodiments disclosed herein. Example 1 is a shielding apparatus, including: first and second conductive regions; and a plurality of vias disposed between the first and second conductive regions; wherein the first and second conductive regions and the plurality of vias surround an IC component and individual vias of the plurality of vias are spaced relative to one another to shield incoming or outgoing EMI.

Example 2 may include the subject matter of Example 1, and may further specify that the plurality of vias includes an outer ring of vias and an inner ring of vias.

Example 3 may include the subject matter of any of Examples 1-2, and may further specify that the plurality of vias includes a plurality of layers of vias coupled by metal layers.

Example 4 may include the subject matter of any of Examples 1-3, and may further specify that at least some of the plurality of vias are arranged in a ring.

Example 5 may include the subject matter of any of Examples 1-4, and may further specify that the first conductive region is disposed in a metal stack formed on an active side of an IC die.

Example 6 may include the subject matter of Example 5, and may further specify that the second conductive region is disposed in a semiconductor portion of the IC die.

Example 7 may include the subject matter of any of Examples 1-4, and may further specify that the first conductive region is disposed in a redistribution layer between two IC dies.

Example 8 may include the subject matter of any of Examples 1-4, and may further specify that the first conductive region is disposed in a metal stack formed on an inactive side of an IC die.

Example 9 may include the subject matter of Example 8, and may further specify that the IC die is a first IC die, a metal stack of a second IC die is disposed between a semiconductor portion of the second IC die and the first IC die, and the second conductive region is disposed in the semiconductor substrate of the second IC die.

Example 10 may include the subject matter of Example 9, and may further specify that the plurality of vias comprises a plurality of vias in a redistribution layer between the first IC die and the second IC die.

Example 11 may include the subject matter of any of Examples 1-4, and may further specify that the first conductive region is disposed in a metal stack disposed on an active side of a first IC die, the second conductive region is disposed in a redistribution layer between the first IC die and a second IC die, and at least some of the plurality of vias are disposed in a semiconductor portion of the first IC die.

Example 12 may include the subject matter of Example 11, and may further specify that at least some of the plurality of vias are disposed in the metal stack of the first IC die.

Example 13 may include the subject matter of any of Examples 1-12, and may further include a conductive partition extending into a volume surrounded by the plurality of vias.

Example 14 may include the subject matter of any of Examples 1-13 and may further include a TSC extending through the second conductive region to couple with the IC component.

Example 15 is an IC package, including: a package substrate; a first die; a second die, wherein the first die is disposed between the package substrate and the second die; and a shielding apparatus. The shielding apparatus may include first and second conductive regions, and a plurality of vias disposed between the first and second conductive regions. The first and second conductive regions and the plurality of vias may surround an IC component included in at least one of the first die or the second die, and wherein individual vias of the plurality of vias are spaced relative to one another to shield incoming or outgoing EMI.

Example 16 may include the subject matter of Example 15, and may further include a TSC extending through the second conductive region to couple with the IC component.

Example 17 may include the subject matter of Example 16, and may further specify that the TSC is a TSV.

Example 18 may include the subject matter of any of Examples 16-17, and may further include a filter circuit coupled to the TSC.

Example 19 may include the subject matter of Example 18, and may further specify that the filter circuit comprises a MIM capacitor.

Example 20 may include the subject matter of any of Examples 16-19, and may further specify that the IC component is disposed in the first die and the second conductive region is disposed in a redistribution layer between the first die and the second die example 20 may also include a conductive pathway, extending from the TSC, through the redistribution layer, into the second die, and back into the first die, to transmit a signal to and/or from the IC component.

Example 21 may include the subject matter of any of Examples 16-19, and may further specify that the IC component is disposed in the first die and the first conductive region is disposed in a metal stack formed on an active side of the first die. Example 21 may also include a conductive pathway, extending from the TSC and into the second die, to transmit a signal to and/or from the IC component.

Example 22 may include the subject matter of Example 15, and may further specify that the shielding apparatus is a first shielding apparatus. Example 22 may also include a second shielding apparatus, including: first and second conductive regions of the second shielding apparatus, and a plurality of vias of the second shielding apparatus disposed between the first and second conductive regions of the second shielding apparatus. The first and second conductive regions of the second shielding apparatus and the plurality of vias of the second shielding apparatus may surround a second IC component, different from the IC component, included in at least one of the first die or the second die, and individual vias of the plurality of vias of the second shielding apparatus may be spaced relative to one another to shield incoming or outgoing EMI.

Example 23 is a method of shielding an IC component, including: forming a conductive region; forming a plurality of vias, at least some of the vias extending from the conductive region; forming an IC component in a volume surrounded by the plurality of vias, wherein individual vias of the plurality of vias are spaced relative to one another to shield incoming or outgoing EMI; and forming another conductive region such that the IC component and the plurality of vias are disposed between the conductive regions.

Example 24 may include the subject matter of Example 23, and may further specify that forming the plurality of vias includes forming the plurality of vias in two or more via layers separated by one or more metal layers.

Example 25 may include the subject matter of any of Examples 22-24, and may further include forming a TSC extending through the conductive region to couple with the IC component.

What is claimed is:

1. A method of shielding an integrated circuit (IC) component, comprising:
   forming a conductive region;
   forming a plurality of vias;
   forming an IC component in a volume surrounded by the plurality of vias, wherein individual vias of the plurality of vias are spaced relative to one another to shield incoming or outgoing electromagnetic interference (EMI); and
   forming another conductive region such that the IC component and the plurality of vias are disposed between the conductive regions.

2. The method of claim 1, wherein forming the plurality of vias comprises forming the plurality of vias in two or more via layers separated by one or more metal layers.

3. The method of claim 1, further comprising:
   forming a through silicon connection (TSC) extending through the conductive region to couple with the IC component.

4. The method of claim 1, wherein the plurality of vias comprises an outer ring of vias and an inner ring of vias.

5. The method of claim 1, wherein at least some of the plurality of vias are arranged in a ring.

6. The method of claim 1, wherein forming the conductive region includes forming the conductive region in a metal stack formed on an active side of an IC die.

7. The method of claim 1, wherein forming the conductive region includes forming the conductive region in a semiconductor portion of an IC die.

8. The method of claim 1, wherein forming the conductive region includes forming the conductive region in a redistribution layer between two IC dies.

9. The method of claim 1, wherein forming the conductive region includes forming the conductive region in a metal stack formed on an inactive side of an IC die.

10. The method of claim 1, wherein at least some of the vias of the plurality of vias extend from the conductive region.

* * * * *